(12) United States Patent
Chao et al.

(10) Patent No.: US 8,035,993 B2
(45) Date of Patent: Oct. 11, 2011

(54) CIRCUIT BOARD

(75) Inventors: Shih-Chieh Chao, Taipei (TW);
Chih-Wen Huang, Tapei (TW);
Chun-Lin Liao, Taipei (TW)

(73) Assignee: Tatung Company, Taipei (TW)

( * ) Notice: Subject to any disclaimer, the term of this patent is extended or adjusted under 35 U.S.C. 154(b) by 332 days.

(21) Appl. No.: 12/422,292

(22) Filed: Apr. 13, 2009

(65) Prior Publication Data

US 2010/0172111 A1 Jul. 8, 2010

(30) Foreign Application Priority Data

Jan. 8, 2009 (TW) .............................. 98100493 A

(51) Int. Cl.
*H05K 9/00* (2006.01)
(52) U.S. Cl. ........ 361/818; 361/780; 361/794; 361/799; 361/816
(58) Field of Classification Search .................. 361/760, 361/761, 728, 748, 780, 782, 792–796, 800, 361/799, 816, 818, 679.01; 174/350, 355, 174/394, 261, 262, 32; 250/515.1; 307/91; 333/12
See application file for complete search history.

(56) References Cited

U.S. PATENT DOCUMENTS

| 2004/0124940 A1* | 7/2004 | Ryu et al. ..................... 333/12 |
| 2005/0168238 A1* | 8/2005 | Wu et al. ........................ 326/27 |
| 2005/0205292 A1* | 9/2005 | Rogers et al. ................ 174/255 |
| 2008/0158840 A1* | 7/2008 | Chen et al. .................... 361/782 |

FOREIGN PATENT DOCUMENTS

| TW | I233775 | 6/2005 |
| TW | 200738125 | 10/2007 |
| TW | 200814889 | 3/2008 |
| TW | 200829093 | 7/2008 |

OTHER PUBLICATIONS

Article Titled "A Novel Power Plane With Integrated Simultaneous Switching Noise Mitigation Capability Using High Impedance Surface" jointly authored by Kamgaing et al., in IEEE, vol. 13, No. 1, Jan. 2003 (pp. 21-23).
Article Titled "High-Impedance Electromagnetic Surfaces with a Forbidden Frequency Band" jointly authored by Sievenpiper et al., in IEEE, vol. 47, No. 11, Nov. 1999 (pp. 2059-2074).

* cited by examiner

*Primary Examiner* — Hoa C Nguyen
(74) *Attorney, Agent, or Firm* — Jianq Chyun IP Office

(57) ABSTRACT

A circuit board including a first patterned metal layer and a second patterned metal layer is provided. The first patterned metal layer has metal blocks and spiral structures. A gap is kept between any two adjacent metal blocks. Each of the spiral structures is electrically connected between any two adjacent metal blocks. The second patterned metal layer is disposed beside the first patterned metal layer and has jumper segments. Each of the jumper segments has a first end and a second end opposite to the first end. Each of the spiral structures has an outer end and an inner end. The outer end is connected to one of the two adjacent metal blocks. The inner end is electrically connected to the first end of one of the jumper segments, and the second end of the jumper segment is electrically connected to the other one of the two the metal blocks.

13 Claims, 15 Drawing Sheets

CIRCUIT BOARD

CROSS-REFERENCE TO RELATED APPLICATION

This application claims the priority benefit of Taiwan application serial no. 98100493, filed Jan. 8, 2009. The entirety of the above-mentioned patent application is hereby incorporated by reference herein and made a part of specification.

BACKGROUND OF THE INVENTION

1. Field of the Invention

The present invention relates to a circuit board, and more particularly, the present invention relates to a circuit board that reduces electromagnetic noise and interference.

2. Description of Related Art

The functions of electronic products are getting more complicated due to rapid development of technology. To increase the convenience for users, electronic products are also getting lighter, thinner, and smaller. To this end, the printed circuit board on which electronic elements are installed in electronic products is also made smaller, and the electronic elements are installed more closely to one another on the printed circuit board. Therefore, it becomes an even more important issue how each of the electronic elements on the circuit board can be prevented from the electromagnetic noise and interference generated by themselves.

The electromagnetic noise and interference within a multi-layer printed circuit board mainly comes from high-speed digital signals or high-power elements, such as clock generators and power amplifiers. The noise can be transmitted as electromagnetic waves through the medium of a circuit board to the other elements on the printed circuit board. Since the distance between the metal power plane and the ground plane inside the multi-layer printed circuit board are almost the same, a parallel plate structure that transmits electromagnetic noise tends to be formed in the area sandwiched between the two metal layers.

To prevent the functioning of other elements from being affected by the electromagnetic noise, a method frequently adopted is to connect a decoupling capacitor near an IC. By using the low impedance of a decoupling capacitor at a high frequency, the electromagnetic noise of a high frequency can be effectively eliminated.

However, due to effective serial inductance of a capacitor, the decoupling capacitor cannot effectively filter out electromagnetic noise above 500 MHz.

SUMMARY OF THE INVENTION

The present invention provides a circuit board that filters out electromagnetic noise with a wider frequency range.

An embodiment of the present invention provides a circuit board, including a first patterned metal layer and a second patterned metal layer. The first patterned metal layer includes a plurality of metal blocks and a plurality of spiral structures. A gap is kept between any two adjacent ones of the metal blocks. Each of the spiral structures is electrically connected between any two adjacent ones of the metal blocks. The second patterned metal layer is disposed at a side of the first patterned metal layer, and includes a plurality of jumper segments. Each of the jumper segments has a first end and a second end opposite to the first end. Each of the spiral structures has an outer end and an inner end. The outer end is connected to one of two adjacent ones of the metal blocks. The inner end is connected to the first end of one of the jumper segments, and the second end of the jumper segment is electrically connected to another one of the two adjacent ones of the metal blocks.

In an embodiment of the present invention, the first patterned metal layer is a power plane, and the second patterned metal layer is a ground plane or a signal plane.

In an embodiment of the present invention, the first patterned metal layer is a ground plane, and the second patterned metal layer is a power plane or a signal plane.

In an embodiment of the present invention, the metal blocks are arranged in a two-dimensional array. The two-dimensional array is a periodic two-dimensional array, for example. The areas of the metal blocks can be substantially identical to one another.

In an embodiment of the present invention, each of the spiral structures has a geometric center. The spiral structure rotationally extends from the inner end to the outer end circling the geometric center in a single rotary direction. The inner end is at an inner side of the spiral structure, and the outer end is at an outer side of the spiral structure.

In an embodiment of the present invention, the second patterned metal layer has a plurality of openings. The jumper segments are inside the openings without contacting edges of the openings.

In an embodiment of the present invention, the circuit board further includes an insulation layer, which is disposed between the first patterned metal layer and the second patterned metal layer.

In an embodiment of the present invention, the circuit board further includes a plurality of first conductive vias and a plurality of second conductive vias. The first conductive vias penetrate the insulation layer. Each of the first conductive vias is connected between the inner end of one of the spiral structures and the first end of the corresponding jumper segment. The second conductive vias penetrate the insulation layer. Each of the second conductive vias is connected between one of the metal blocks and the second end of the corresponding jumper segment.

In an embodiment of the present invention, the circuit board further includes at least a decoupling capacitor, which is electrically connected between the first patterned metal layer and the second patterned metal layer, wherein one of the first patterned metal layer and the second patterned metal layer is a power plane, and the other one of the first patterned metal layer and the second patterned metal layer is a ground plane.

In an embodiment of the present invention, the circuit board further includes a third patterned metal layer and a decoupling capacitor. The third patterned metal layer is disposed at a side of the first patterned metal layer. The decoupling capacitor is electrically connected between the first patterned metal layer and the third patterned metal layer. The second patterned metal layer is a signal plane. One of the first patterned metal layer and the third patterned metal layer is a power plane, and the other one of the first patterned metal layer and the third patterned metal layer is a ground plane.

In an embodiment of the present invention, each of the metal blocks has at least a notch to contain a part of one of the spiral structures.

Base on the above, in the circuit board of the embodiment of the present invention, the spiral structures and jumper segments are used to connect two adjacent metal blocks. The spiral structures can make the effective inductance value between the two metal blocks higher, so that the circuit board not only maintains the feature of effectively filtering out electromagnetic noise of high frequency, but also effectively filters out electromagnetic noise of low frequency. In other words, the circuit board of the embodiment of the present invention is capable of filtering out electromagnetic noise with a wider frequency range.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1:
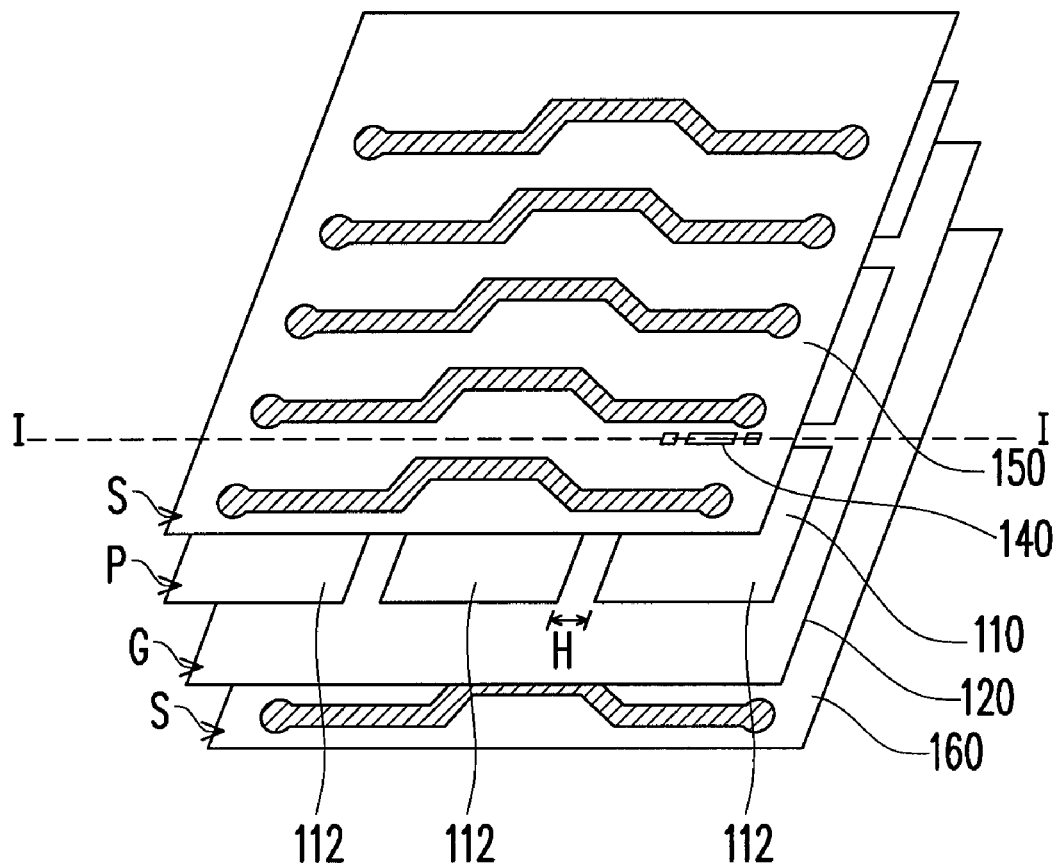
FIG. 1 is a schematic view showing the structure of a circuit board according to the first embodiment of the present invention.
Figure 2:
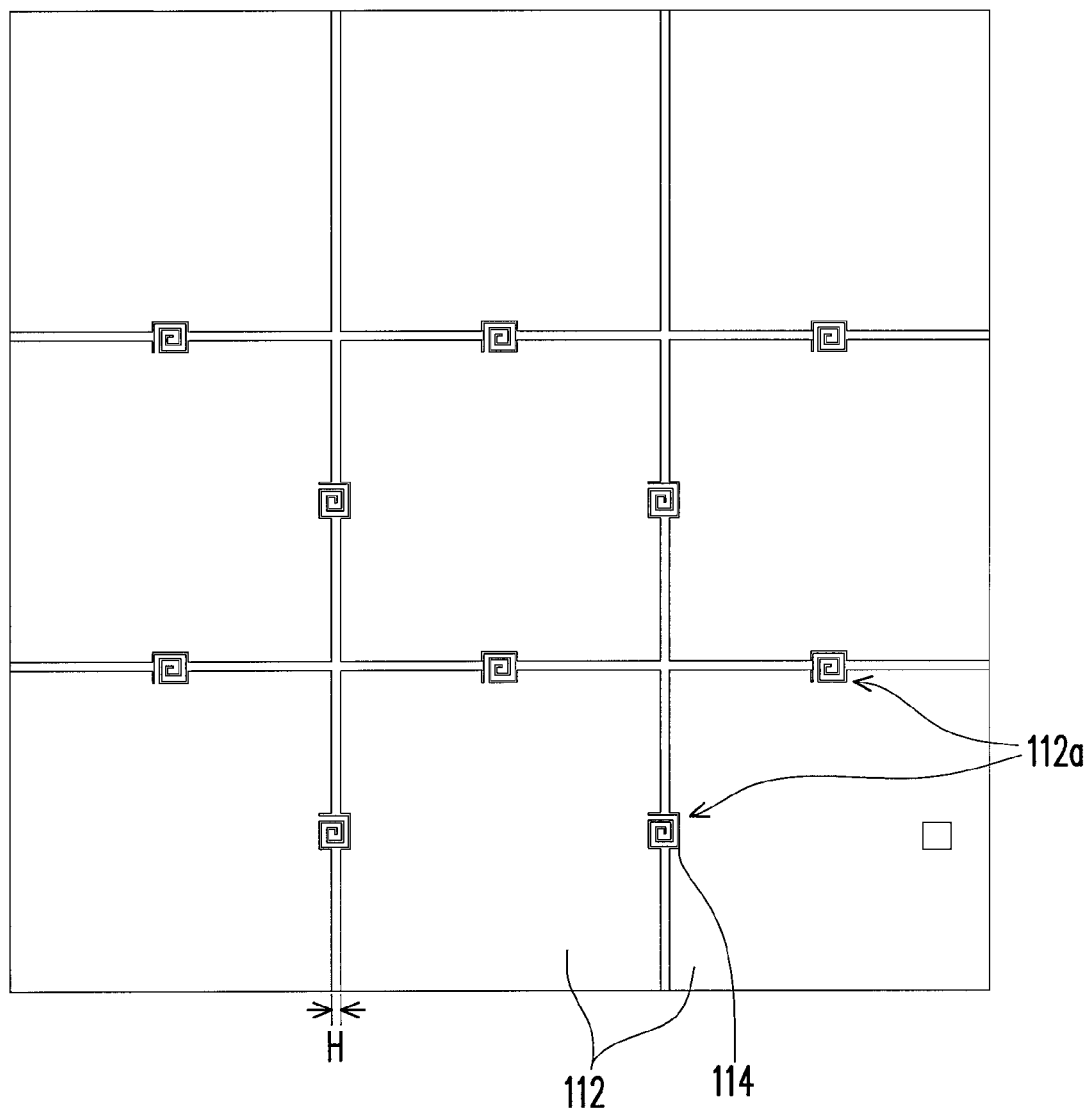
FIG. 2 is a top view of the patterned metal layer 110 in FIG. 1.
Figure 3:
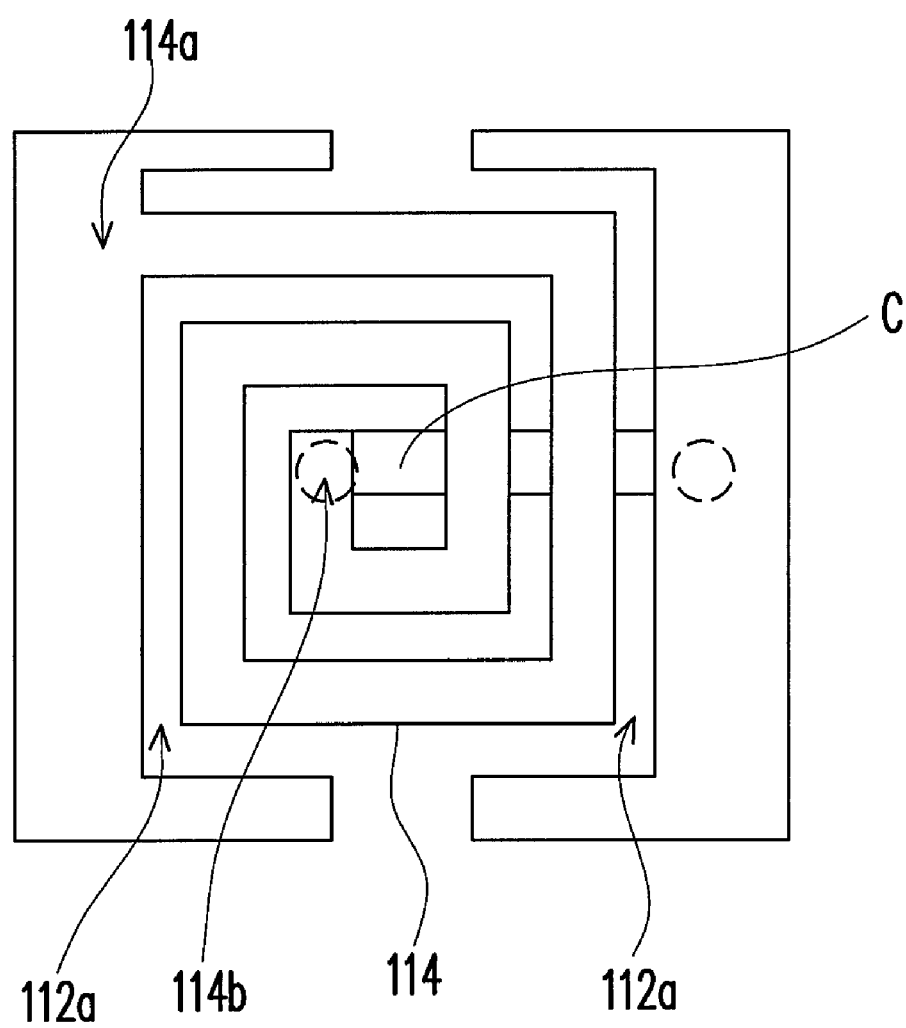
FIG. 3 is a locally enlarged view showing the spiral structures in FIG. 2.

FIG. 1 is a schematic view showing the structure of the circuit board of the first embodiment of the present invention. FIG. 2 is a top view of the patterned metal layer 110 in FIG. 1. FIG. 3 is a locally enlarged view showing the spiral structure in FIG. 2. Referring to FIGS. 1, 2, and 3, a circuit board 100 in this embodiment includes a patterned metal layer 110 and a patterned metal layer 120. The patterned metal layer 110 is a power plane P, and the patterned metal layer 120 is a ground plane G, for example. However, in other embodiments, the pattered metal layer 110 can also be the ground plane G, and the patterned metal layer 120 can also be the power plane P. The patterned metal layer 110 includes a plurality of metal blocks 112 and a plurality of spiral structures 114. A gap H is kept between any two adjacent ones of the metal blocks 112. In this embodiment, the metal blocks 112 are arranged in a two-dimensional array. To be specific, the metal blocks 112 can be arranged in a periodic two-dimensional array. In addition, the areas of the metal blocks 112 can be substantially identical to one another. Each of the spiral structures 114 is electrically connected between any two adjacent ones of the metal blocks 112. In this embodiment, each of the metal blocks 112 has a plurality of notches 112a. Each of the notches 112a is to contain a part of one of the spiral structures 114.

Each of the spiral structures 114 has an outer end 114a and an inner end 114b. In this embodiment, each of the spiral structures 114 has a geometric center C, and rotationally extends from the inner end 114b to the outer end 114a circling the geometric center C in a single direction (for example, in an anti-clockwise direction shown in FIG. 3), wherein the inner end 114b is at an inner side of the spiral structure 114, and the outer end 114a is at an outer side of the spiral structure 114. In other embodiments not accompanied with drawings, the spiral structure 114 can also rotationally extend from the inner end 114b to the outer end 114a circling the geometric center C in a clockwise direction. In other words, the spiral structures 114 can form a plurality of coil structures in the power plane P. By means of mutual inductance between coils, a bigger inductance can be formed in a smaller area in the power plane P. Moreover, the patterned metal layer 120 is disposed at a side of the patterned metal layer 110.

Figure 4:
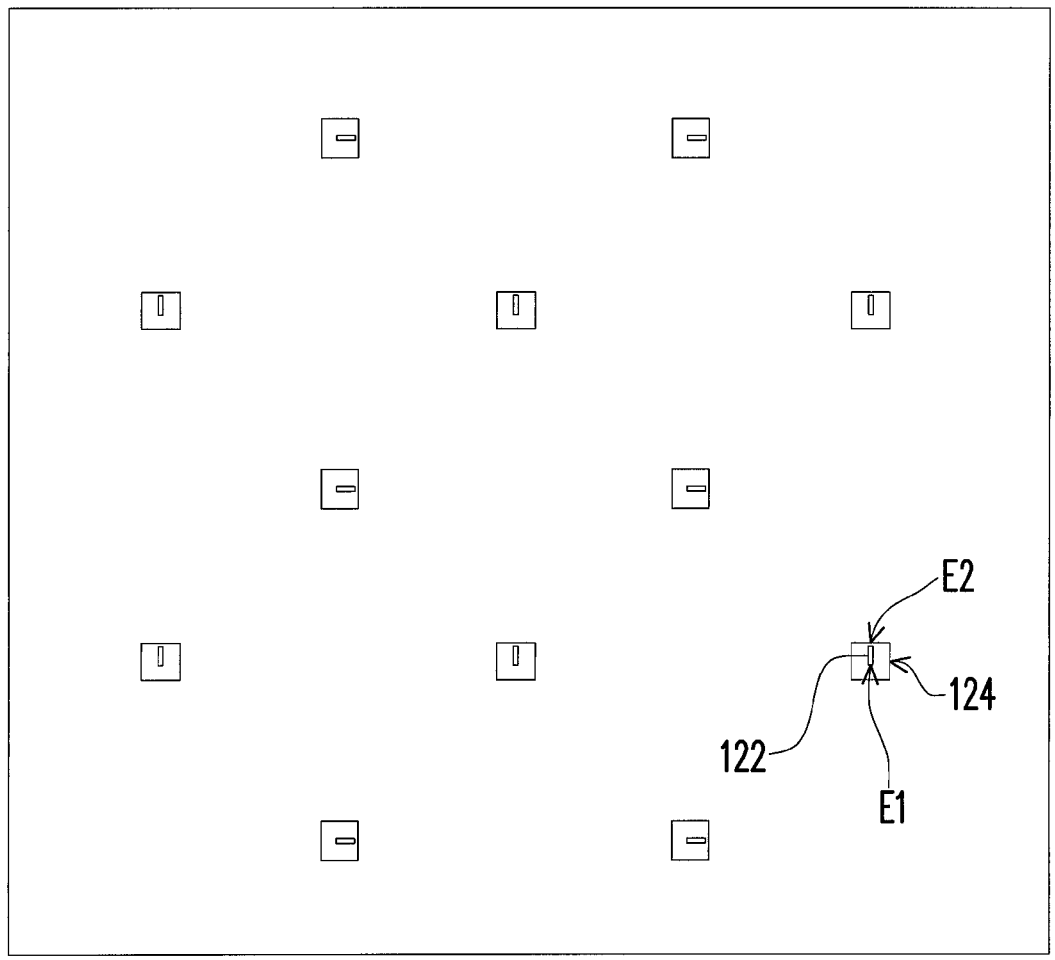
FIG. 4 is a top view of the patterned metal layer 120 in FIG. 1.
Figure 5:
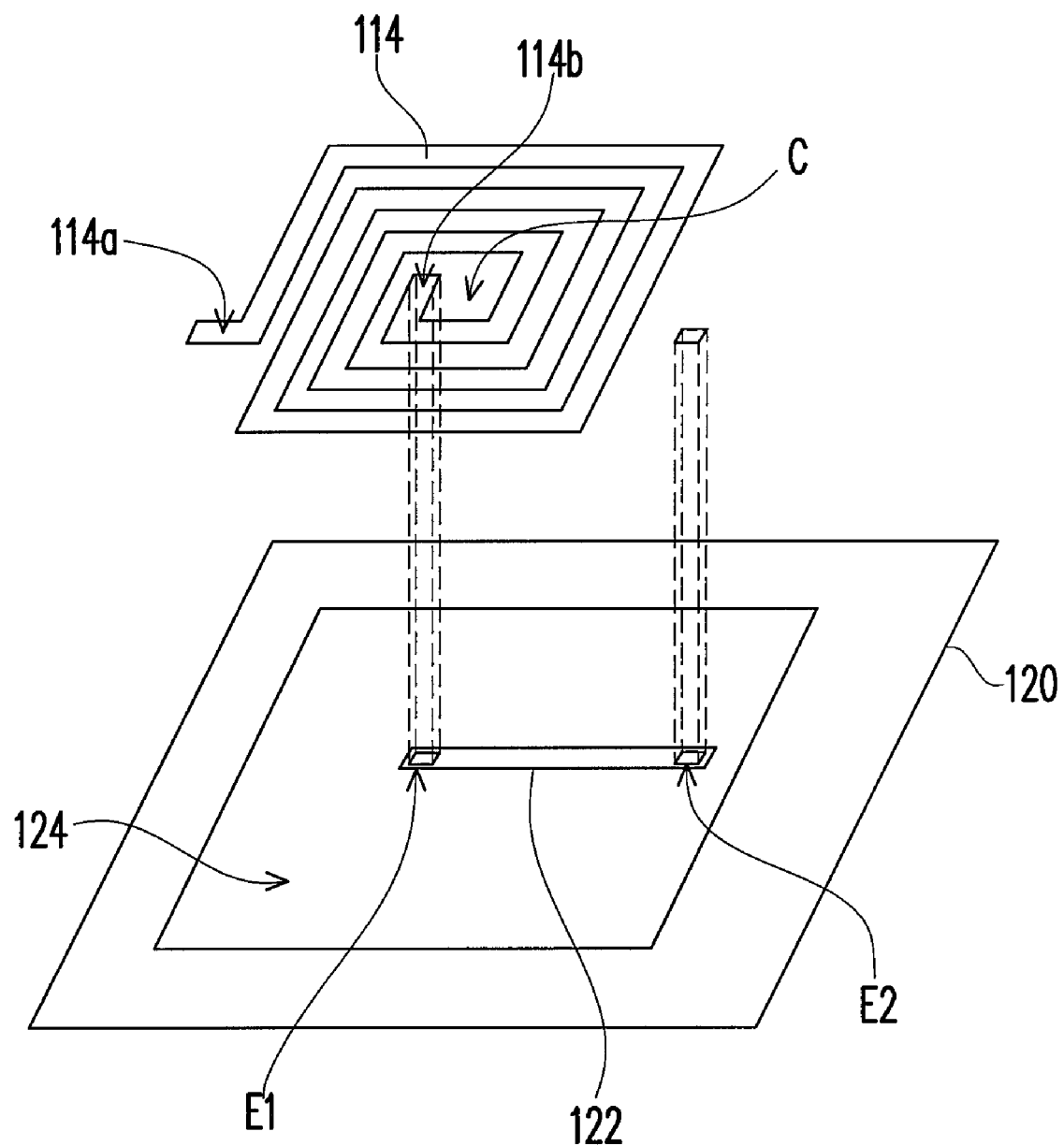
FIG. 5 shows the spiral structures and the structure of jumper segments of the circuit board in FIG. 1.
Figure 6:
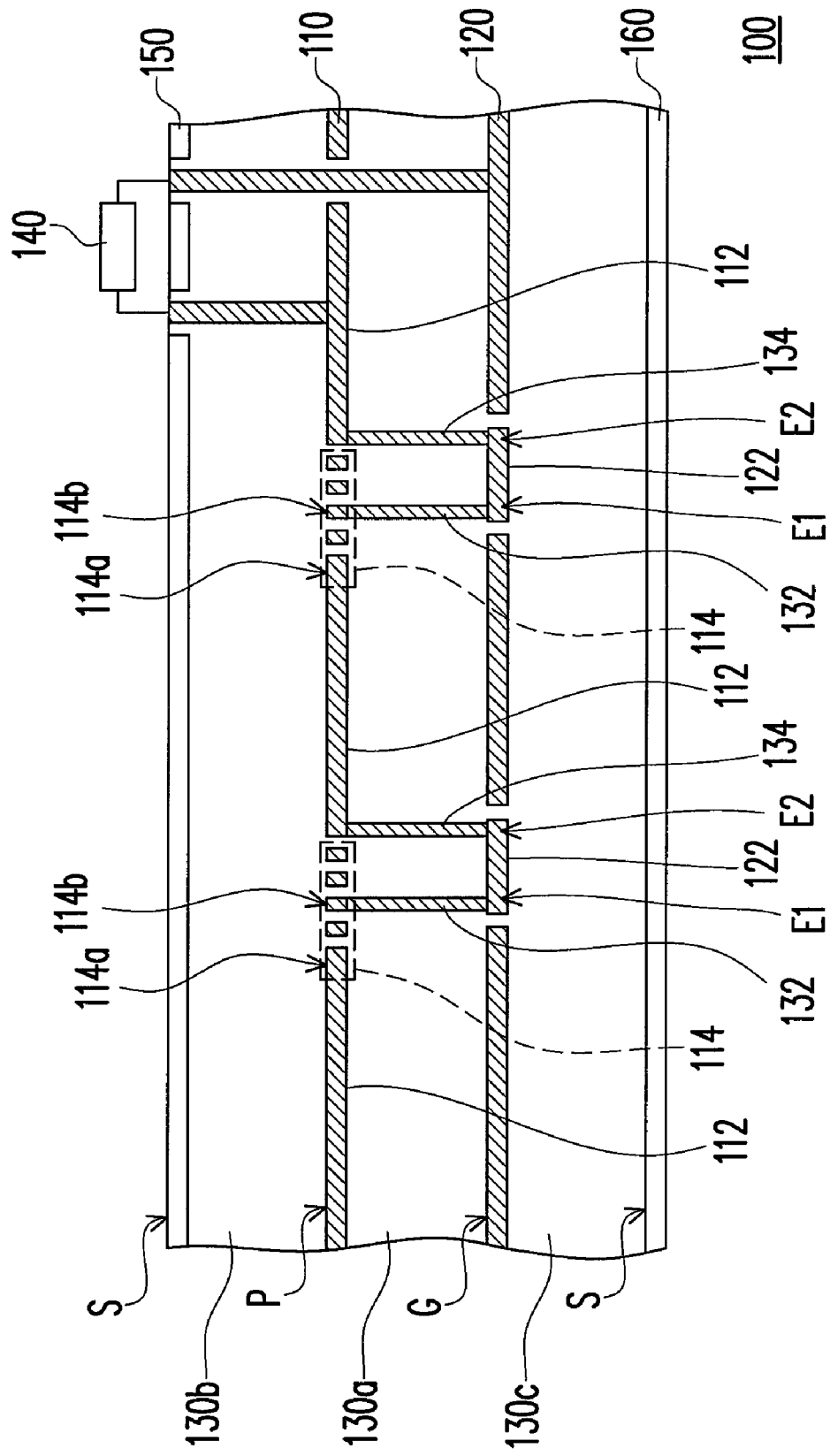
FIG. 6 is a schematic cross-sectional view showing the circuit board in FIG. 1 along line I-I.

FIG. 4 is a top view of the patterned metal layer 120 in FIG. 1. FIG. 5 shows the spiral structures and the structures of the jumper segments on the circuit board in FIG. 1. FIG. 6 is a schematic cross-sectional view of the circuit board 100 in FIG. 1 along line I-I. Referring to FIGS. 4, 5 and 6, in this embodiment, the circuit board 100 includes an insulation layer 130a, disposed between the patterned metal layer 110 and the patterned metal layer 120. The patterned metal layer 120 includes a plurality of jumper segments 122. Each of the jumper segments 122 has a first end E1 and a second end E2 opposite to the first end E1. In this embodiment, the patterned metal layer 120 further includes a plurality of openings 124. The jumper segments 122 are inside the openings 124 respectively without contacting edges of the openings 124. The outer end 114a of each of the spiral structures 114 is connected to one of two adjacent ones of the metal blocks 112. The inner end 114b is electrically connected to the first end E1 of one of the jumper segments 122, and the second end E2 of the jumper segments 122 is electrically connected to the other one of the two adjacent ones of the metal blocks 112. In this embodiment, the circuit board 100 further includes a plurality of first conductive vias 132 and a plurality of second conductive vias 134. The first conductive vias 132 penetrate the insulation layer 130. Each of the first conductive vias 132 is connected between the inner end 114b of one of the spiral structures 114 and the first end E1 of the corresponding jumper segment 122. The second conductive vias 134 penetrate the insulation layer 130. Each of the second conductive vias 134 is connected between one of the metal blocks 112 and the second end E2 of the corresponding jumper segment 122.

In this embodiment, the circuit board 100 further includes a patterned metal layer 150 and a patterned metal layer 160. The patterned metal layer 150 and the patterned metal layer 160 are, for example, signal planes. The patterned metal layer 150 and the patterned metal layer 160 are respectively disposed on two opposite sides of the patterned metal layer 110, and also respectively disposed on two opposite sides of the patterned metal layer 120 (as shown in FIG. 1). An insulation layer 130b is disposed between the patterned metal layer 110 and the patterned metal layer 150, and an insulation layer 130c is disposed between the patterned metal layer 120 and the patterned metal layer 160. In addition, to widen the frequency range in which electromagnetic noise can be filtered out, the circuit board 100 can be used with at least a decoupling capacitor 140, wherein the decoupling capacitor 140 is electrically connected between the patterned metal layer 110 and the patterned metal layer 120. In the other embodiments not accompanied with drawings, the circuit board 100 can further include, for example, a plurality of decoupling capacitors 140, which are electrically connected between the patterned metal layer 110 and the patterned metal layer 120.

In the circuit board 100 of this embodiment, the spiral structure 114 and jumper segment 122 are adopted to connect two adjacent ones of the metal blocks 112. The spiral structure 114 can make the effective inductance value between the two metal blocks 112 higher, so that the circuit board 100 not only maintains the feature of effectively filtering out electromagnetic noise of high frequency, but also effectively filters out electromagnetic noise of low frequency. In other words, the circuit board 100 of this embodiment can filter out electromagnetic noise in a wider frequency range. This feature will be proved by the following simulation examples. Note that the parameters used in the following simulation examples and the produced data are just for illustration purposes, and not intended to limit the present invention. In other simulation examples of the present invention, other parameters can also be used to produce other data, which shall still fall within the protection scope of the present invention.

Figure 7:
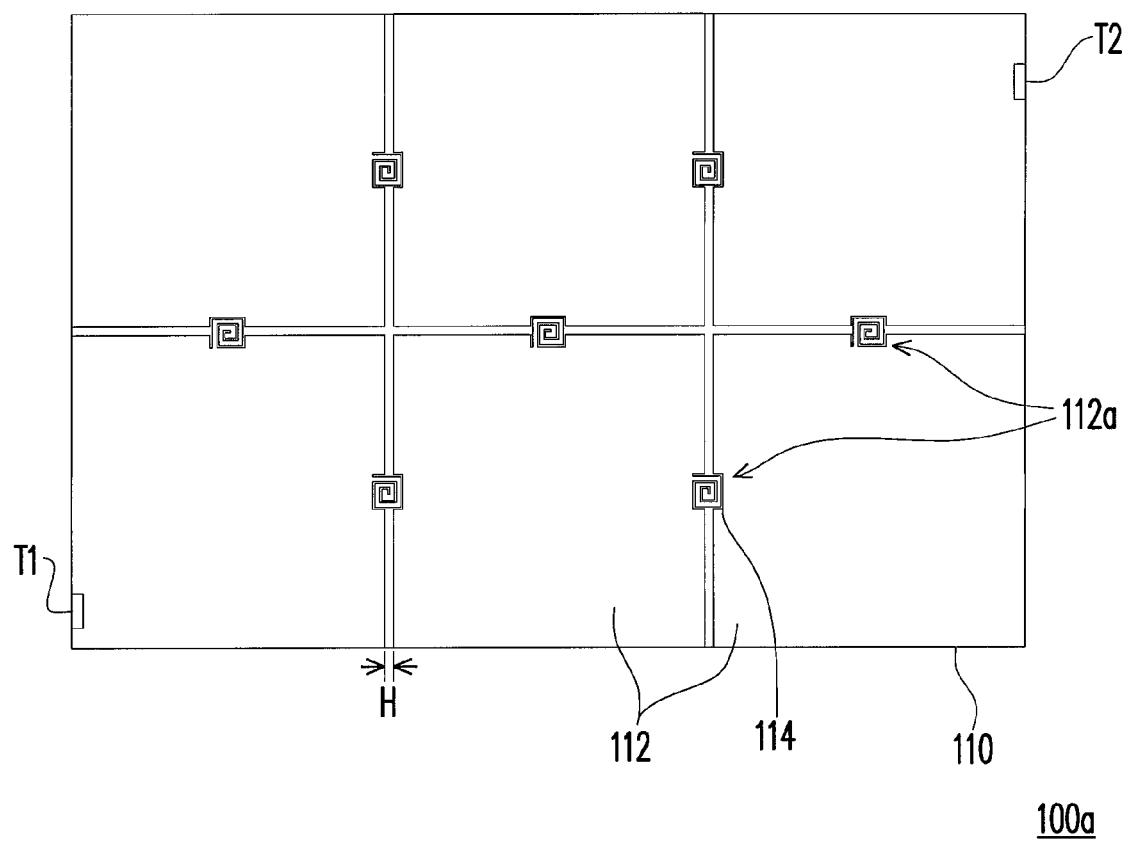
FIG. 7 is a top view of a circuit board added with two ports according to a simulation example.

A first simulation example is provided below. FIG. 7 is a top view of the circuit board in the first simulation example added with two ports. Referring to FIG. 7, a patterned metal layer 110 of a circuit board 100a of 90 mm*60 mm is divided into six metal blocks 112 of 28 mm*28 mm. Every two adjacent blocks of the circuit board 100a is connected by the spiral structure 114, the jumper segment 122, the first conductive via 132, and the second conductive via 134. The medium layer used has a thickness of 0.8 mm and a dielectric constant of 4.4. The two ports on the medium layer are T1 and T2 respectively. The electromagnetic isolation effect between the two ports can be shown by electromagnetic transmission coefficient ($S_{21}$). The lower the electromagnetic transmission coefficient is, the lower the electromagnetic noise transmission is, and the better the electromagnetic isolation effect is.

Figure 8:
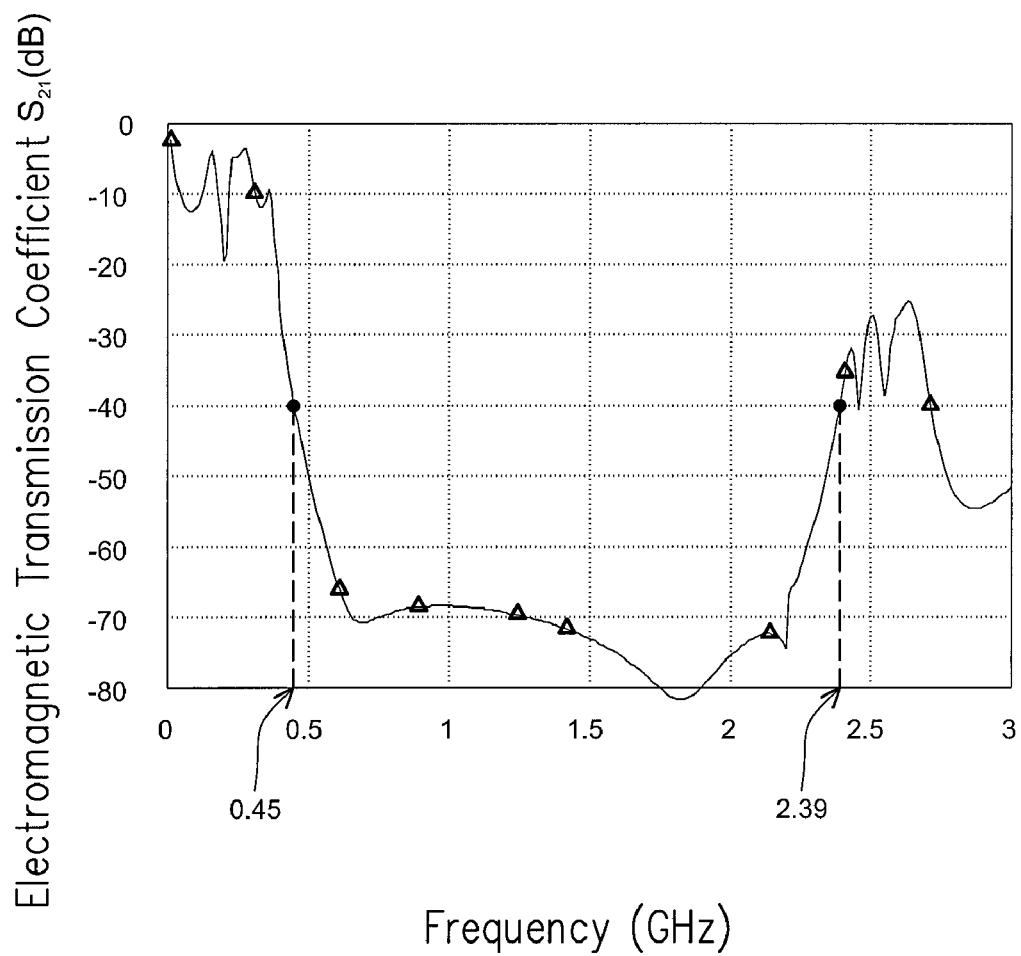
FIG. 8 is the simulation result of electromagnetic transmission coefficient of FIG. 7.

FIG. 8 is the simulation result of electromagnetic transmission coefficient of the circuit board 100a in FIG. 7. Referring to FIG. 8, when using an electromagnetic transmission coefficient of −40 dB as the reference, the stimulation result shows that the stop-band of the circuit board 100a falls in the frequency band range between 0.45 GHz and 2.39 GHz. Note that here the stop-band refers to the frequency range in which electromagnetic noise can be filtered out. The advantage that the lower limit of the frequency band range of stop-band descends to 500 MHz or less lies in that the stop-band can be used with at least a decoupling capacitor 140, so that low-frequency noise with a frequency band equal to or less than 500 MHz can also be filtered out. Accordingly, the circuit board 100a in this embodiment can have a wider frequency range of stop-band, and the electromagnetic noise can be continuously isolated from low frequency to high frequency.

Figure 9:
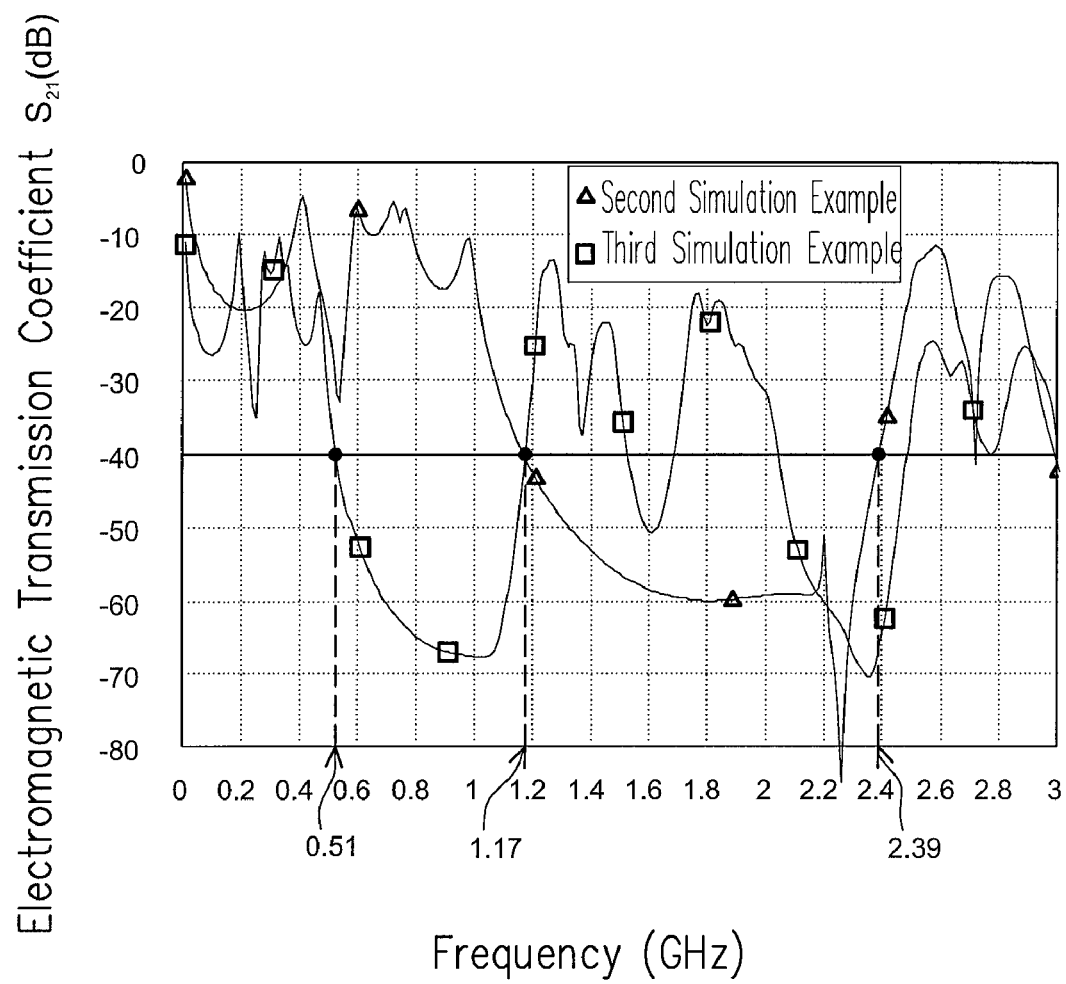
FIG. 9 is the simulation result of the electromagnetic transmission coefficient of a circuit board having straight-line-shaped metal neck lines and a circuit board having metal neck lines and the increased dielectric coefficient of the dielectric layers.

A second simulation example is provided below as the comparison to the embodiments of the present invention. Comparing the structure of the circuit board of the second simulation example with that of the circuit board 100a in FIG. 7, the main difference between the two lies in that every two adjacent metal blocks in the circuit board of the second simulation example are connected by short straight metal neck lines instead. The rest of the structure is substantially identical to that of FIG. 7. FIG. 9 is the simulation result of electromagnetic transmission coefficients of a circuit board having metal neck lines and a circuit board having metal neck lines and increased the dielectric coefficients of the dielectric layer. Referring to FIG. 9, when an electromagnetic transmission coefficient of −40 dB also serves as the reference, the simulation result of the second simulation example shows that the stop-band of the circuit board falls in the frequency band range between 1.17 GHz and 2.39 GHz. The lower limit of the stop-band of the circuit board is 1.17 GHz (higher than 0.45 GHz of the embodiments of the present invention), and the upper limit thereof is close to that of the embodiments of the present invention, such that the electromagnetic noise with a frequency band range between 500 MHz and 1.17 GHz cannot be effectively filtered out.

A third simulation example is provided below as the comparison to the embodiments of the present invention. Comparing the structure of the circuit board of the third simulation example with that of the circuit board 100a in FIG. 7, the main difference between the two lies in that in the circuit board structure of the third simulation example, in addition to replacing the spiral structures 114 with short straight metal neck lines, the dielectric coefficient of the medium layer in the circuit board 100a is changed from 4.4 to 18. The rest of the structure is substantially identical to that of FIG. 7. Referring to FIG. 9, when using an electromagnetic transmission coefficient of −40 dB as the reference, the stimulation result of the third simulation example shows that the stop-band of the circuit board falls in the frequency band range between 0.51 GHz and 1.17 GHz. While the lower limit of the frequency band of the stop-band can shift to about 500 MHz, the upper limit thereof also simultaneously shift to about 1.17 GHz, such that the stop-band of the circuit board has a narrower frequency band range and cannot filter out electromagnetic noise of high frequency.

Figure 10:
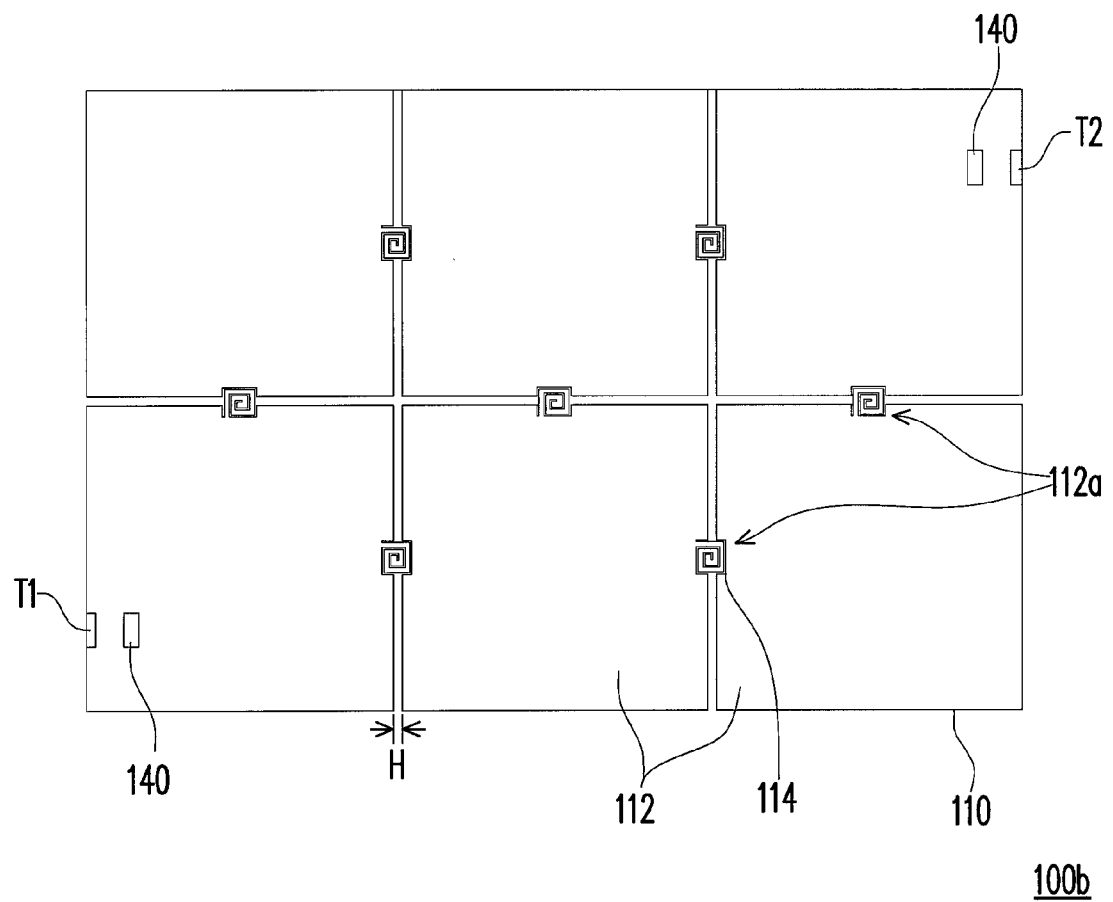
FIG. 10 is a top view of the circuit board in FIG. 7 added with two decoupling capacitors.
Figure 11:
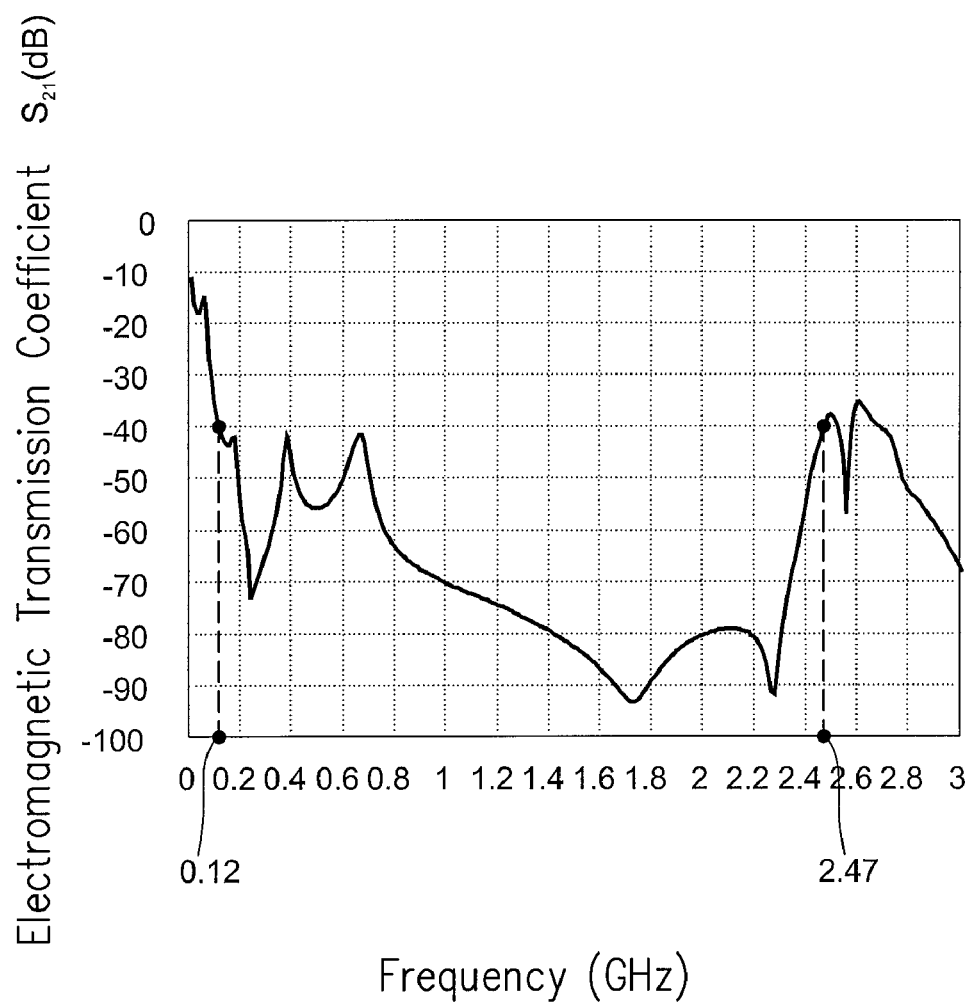
FIG. 11 is the simulation result of electromagnetic transmission coefficient of FIG. 10.

A fourth simulation example is further provided below and also serves as a comparison. FIG. 10 is the top view of the circuit board in FIG. 7 added with two decoupling capacitors. Referring to FIG. 10, a circuit board 100b in the fourth simulation example is formed by respectively disposing two decoupling capacitor 140 5 mm beside the two ports T1 and T2 of the circuit board 100a in the first simulation example. After properly adjusting the capacitance of the decoupling capacitors 140, the electromagnetic transmission coefficient of the present circuit board is as shown in FIG. 11. FIG. 11 is the simulation result of the electromagnetic transmission coefficient of FIG. 10. Referring to FIG. 11, also based on −40 dB, the simulation result shows that the stop-band of the circuit board 100b falls in the frequency band range between 0.12 GHz and 2.47 GHz. The feature of filtering out electromagnetic noise in a high frequency band range is maintained, while electromagnetic noise at lower frequency is further filtered out.

In the circuit board 100 of this embodiment, the four simulation examples show that the frequency band of stop-band obtained by connecting every two of the metal blocks 112 by the spiral structures 114 ranges between 0.45 GHz and 2.39 GHz. Comparatively, the frequency band of the stop-band obtained by connecting with short metal neck lines only ranges between 1.17 GHz and 2.39 GHz. Apparently, the stop-band range obtained by the spiral structures 114 covers the entire stop-band range obtained by short metal neck lines, and filters out electromagnetic noise at lower frequency.

Moreover, in addition to the original structure connected by short metal neck lines, the stop-band obtained by further raising the dielectric coefficient of the circuit board ranges between 0.51 GHz and 1.17 GHz. While the lower limit of the frequency band of the stop-band is lowered to about 500 MHz, the upper limit thereof is also lowered simultaneously, and the obtained frequency band range of the stop-band is narrower instead. Therefore, the frequency band range of the stop-band obtained by connecting the metal blocks by spiral structures 114 is obviously better than those obtained by the circuit board structures in the second and third simulation examples. In other words, the circuit board 100a in this embodiment filters out electromagnetic noise having a stop-band of either high or low frequency range.

Lastly, by adding a decoupling capacitor 140 beside the two ports T1 and T2 respectively on the circuit board 100a having the spiral structures 114, the lower limit of the stop-band is further lowered to 0.12 GHz, while the upper limit keeps unchanged. In other words, the circuit board 100a having spiral structures accompanied with a plurality of decoupling capacitors 140 filters out electromagnetic noise in a wider frequency range.

Second Embodiment

Figure 12:
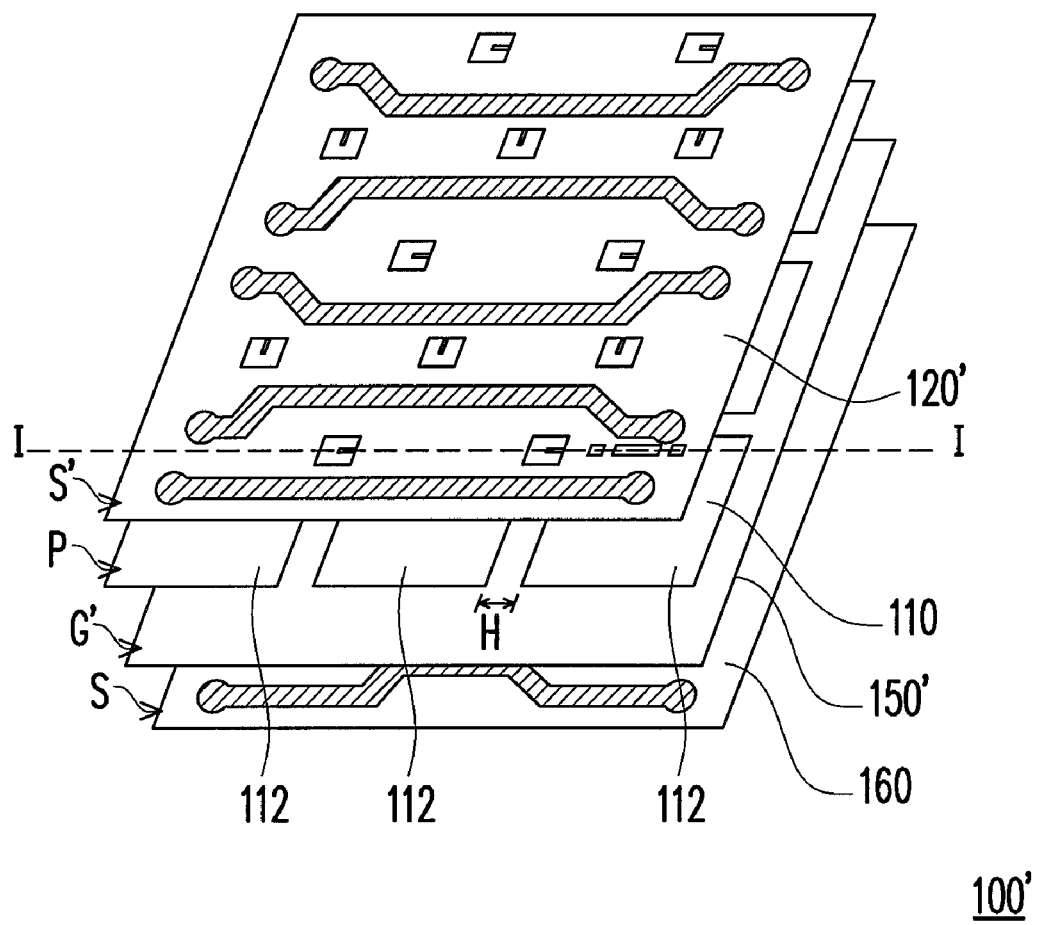
FIG. 12 is a schematic view showing the structure of the circuit board according to the second embodiment of the present invention.
Figure 13:
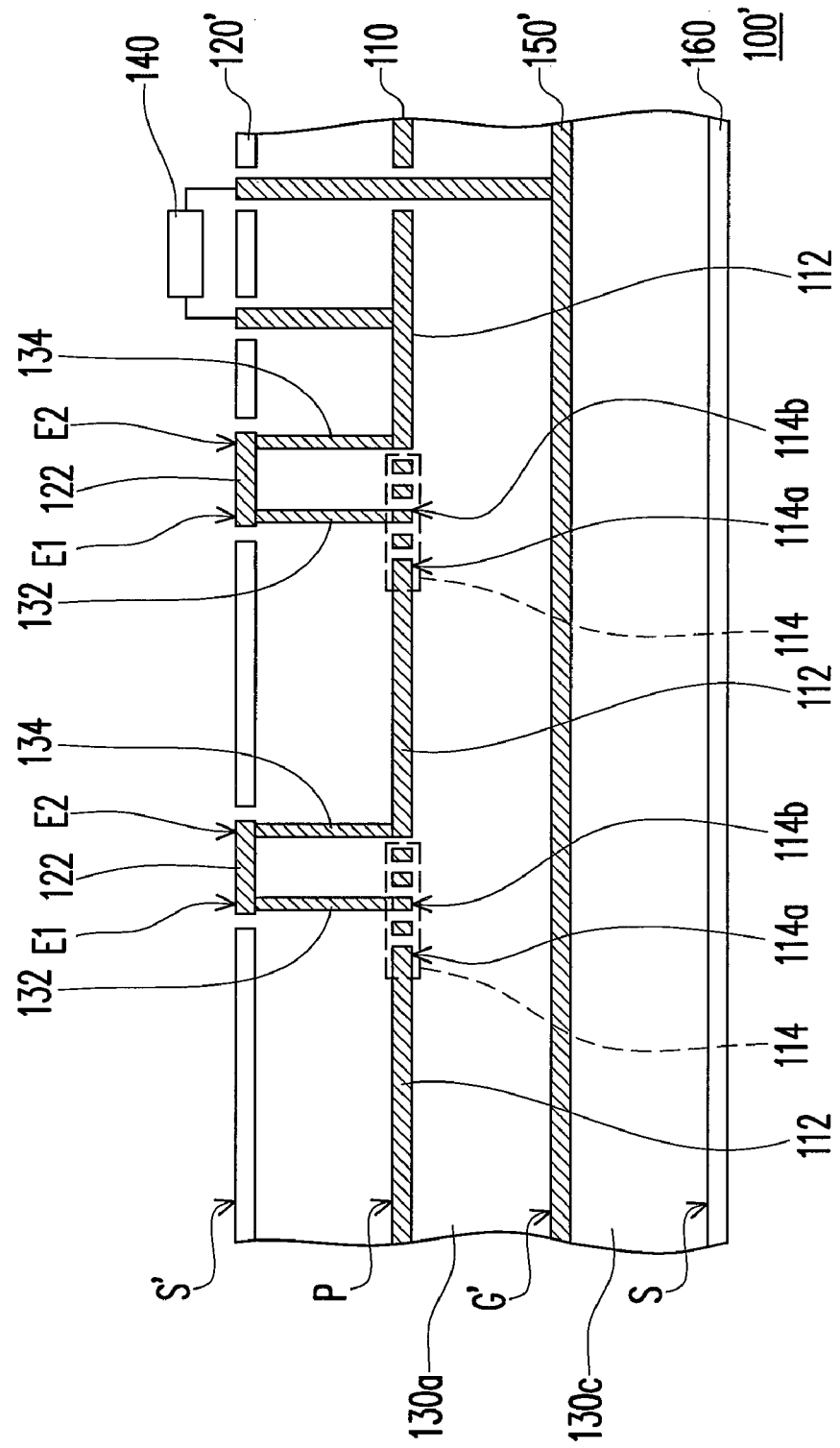
FIG. 13 is a schematic cross-sectional view showing the circuit board in FIG. 12 along line I-I.

FIG. 12 is a schematic view showing the structure of the circuit board in the second embodiment of the present invention. FIG. 13 is a schematic cross-sectional view of the circuit board in FIG. 12 along line I-I. Referring to FIGS. 12 and 13, a circuit board 100' and the above circuit board 100 (shown in FIGS. 1 and 6) are similar in structure. The main difference between the two circuit boards lies in that a patterned metal layer 120' having jumper segments 122 is, for example, a signal plane S', and a metal layer 150' is, for example, a ground plane G', wherein the metal layer 150' is a continuous and complete plane metal layer, and thus can maintain better equi-potential.

Third Embodiment

Figure 14:
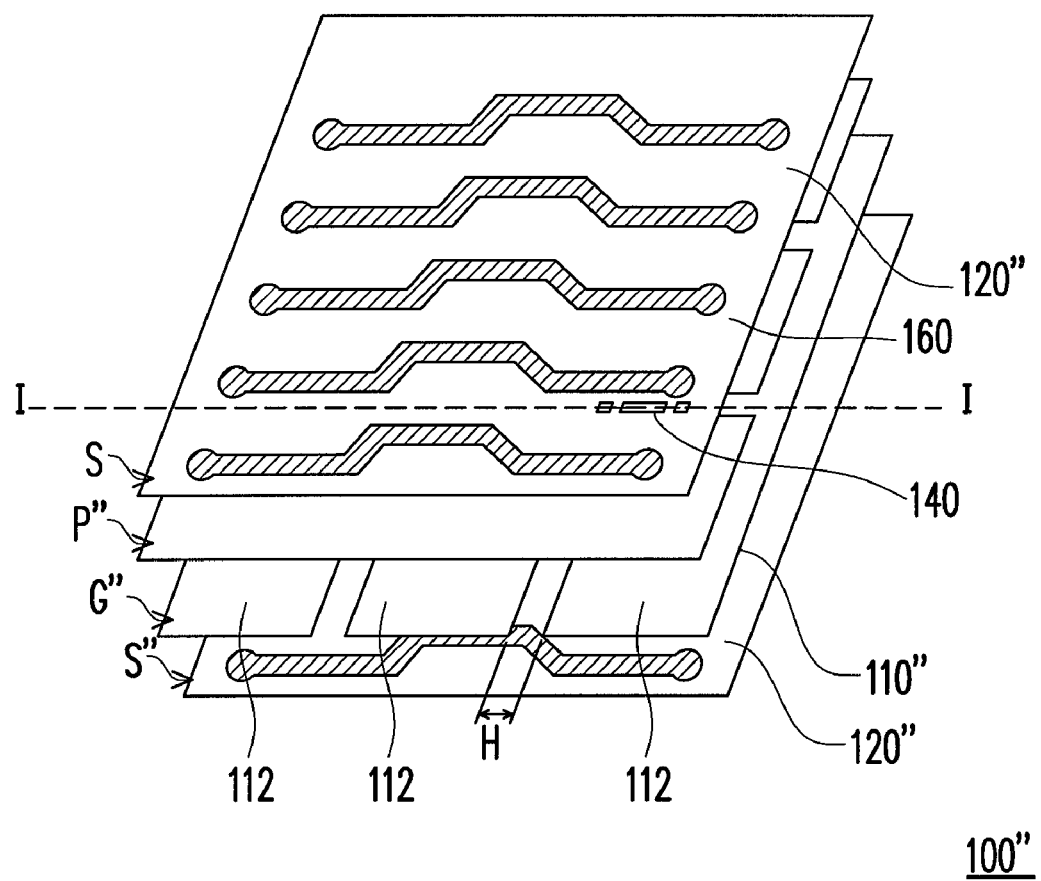
FIG. 14 is a schematic view showing the structure of the circuit board in the third embodiment of the present invention.
Figure 15:
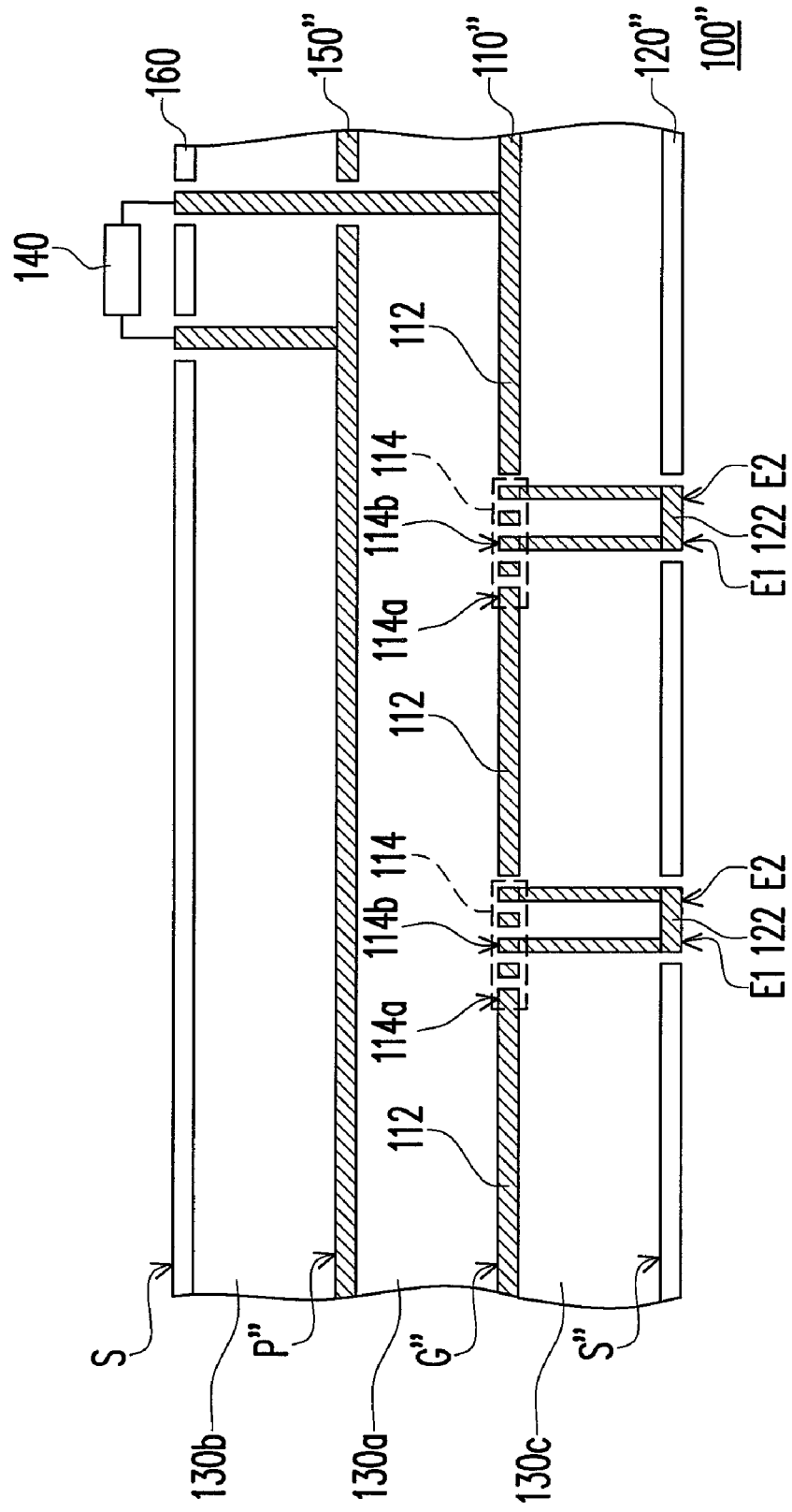
FIG. 15 is a schematic cross-sectional view showing the circuit board in FIG. 14 along line I-I.

FIG. 14 is a schematic view showing the structure of the circuit board in the third embodiment of the present invention. FIG. 15 is a schematic cross-sectional view of the circuit board in FIG. 14 along line I-I. Referring to FIGS. 14 and 15, a circuit board 100" of this present embodiment and the above circuit board 100 (shown in FIGS. 1 and 6) are similar in structure. The main difference between the two circuit boards lies in that a patterned metal layer 110" having metal blocks 100 in this embodiment is a ground plane G"; a patterned metal layer 120" having jumper segments 122 is a signal plane S", and a patterned metal layer 150" is, for example, a power plane P". The patterned metal layer 120", the insulation layer 130c, the patterned metal layer 110", the insulation layer 130a, the patterned metal layer 150", the insulation layer 130b, and the patterned metal layer 160 are arranged in sequence from one side of the circuit board 100" to the other side thereof.

In summary, the circuit board in the embodiments of the present invention adopts a plurality of spiral structures, a plurality of jumper segments, a plurality of first conductive vias, and a plurality of second conductive vias to connect. Through the characteristic of achieving large effective inductance value within a small area by a spiral structure, the circuit board not only maintains the feature of effectively filtering out electromagnetic noise of high frequency, but also has the feature of effectively filtering out electromagnetic noise of low frequency. In other words, the circuit board of the embodiments of the present invention filters out electromagnetic noise in wider frequency range. In addition, the circuit board in the embodiments of the present invention, added with a plurality of decoupling capacitors for filtering out electromagnetic noise of low frequency, further filters out electromagnetic noise with lower frequency band.

Although the present invention has been disclosed by the above embodiments, they are not intended to limit the present invention. Any person having ordinary knowledge in the art may make modifications and variations without departing from the spirit and scope of the present invention. Therefore, the protection scope sought by the present invention falls in the appended claim.

What is claimed is:

1. A circuit board, comprising:
   a first patterned metal layer, comprising:
      a plurality of metal blocks, wherein a gap is kept between any two adjacent ones of the metal blocks; and
      a plurality of spiral structures, each of the spiral structures being electrically connected between two adjacent ones of the metal blocks; and
   a second patterned metal layer, disposed at a side of the first patterned metal layer, the second patterned metal layer comprising a plurality of jumper segments, each of the jumper segments having a first end and a second end opposite to the first end, wherein each of the spiral structures has an outer end and an inner end, the outer end is connected to one of the two adjacent ones of the metal blocks, the inner end is electrically connected to the first end of one of the jumper segments, and the second end of the one of the jumper segments is electrically connected to the other one of the two adjacent ones of the metal blocks.

2. The circuit board according to claim 1, wherein the first patterned metal layer is a power plane, and the second patterned metal layer is a ground plane or a signal plane.

3. The circuit board according to claim 1, wherein the first patterned metal layer is a ground plane, and the second patterned metal layer is a power plane or a signal plane.

4. The circuit board according to claim 1, wherein the metal blocks are arranged in a two-dimensional array.

5. The circuit board according to claim 4, wherein the two-dimensional array is a periodic two-dimensional array.

6. The circuit board according to claim 4, wherein areas of the metal blocks are substantially identical.

7. The circuit board according to claim 1, wherein each of the spiral structures has a geometric center, the spiral structure rotationally extending from the inner end to the outer end circling the geometric center in a single rotary direction, the inner end being at an inner side of the spiral structure, and the outer end being at an outer side of the spiral structure.

8. The circuit board according to claim 1, wherein the second patterned metal layer has a plurality of openings, and the jumper segments are respectively located inside the openings without contacting edges of the openings.

9. The circuit board according to claim 1, further comprising an insulation layer disposed between the first patterned metal layer and the second patterned metal layer.

10. The circuit board according to claim 9, further comprising:
   a plurality of first conductive vias penetrating the insulation layer, wherein each of the first conductive vias is connected between the inner end of one of the spiral structures and the first end of the corresponding jumper segment; and a plurality of second conductive vias penetrating the insulation layer, wherein each of the second conductive vias is connected between one of the metal blocks and the second end of the corresponding jumper segment.

11. The circuit board according to claim 1, further comprising at least a decoupling capacitor electrically connected between the first patterned metal layer and the second patterned metal layer, wherein one of the first patterned metal layer and the second patterned metal layer is a power plane, and the other one of the first patterned metal layer and the second patterned metal layer is a ground plane.

12. The circuit board according to claim 1, further comprising:

a third patterned metal layer, disposed at a side of the first patterned metal layer; and a decoupling capacitor, electrically connected between the first patterned metal layer and the third patterned metal layer, wherein the second patterned metal layer is a signal plane, one of the first patterned metal layer and the third patterned metal layer is a power plane, and the other one of the first patterned metal layer and the third patterned metal layer is a ground plane.

13. The circuit board according to claim 1, wherein each of the metal blocks has at least a notch, so as to contain a part of one of the spiral structures.

* * * * *

UNITED STATES PATENT AND TRADEMARK OFFICE
CERTIFICATE OF CORRECTION

| | | |
|---|---|---|
| PATENT NO. | : 8,035,993 B2 | Page 1 of 1 |
| APPLICATION NO. | : 12/422292 | |
| DATED | : October 11, 2011 | |
| INVENTOR(S) | : Chao et al. | |

It is certified that error appears in the above-identified patent and that said Letters Patent is hereby corrected as shown below:

On the Title page of the patent grant, please replace item (54) and Col. 1 with:

CIRCUIT BOARD HAVING ELECTROMAGNETIC NOISE FILTER STRUCTURES

Signed and Sealed this
Twentieth Day of December, 2011

David J. Kappos
*Director of the United States Patent and Trademark Office*